United States Patent
Joi et al.

(10) Patent No.: US 12,278,112 B2
(45) Date of Patent: Apr. 15, 2025

(54) MULTIPLE STATE PULSING FOR HIGH ASPECT RATIO ETCH

(71) Applicant: Lam Research Corporation, Fremont, CA (US)

(72) Inventors: Aniruddha Joi, Milpitas, CA (US); Nikhil Dole, Castro Valley, CA (US); Merrett Wong, San Carlos, CA (US); Eric Hudson, Berkeley, CA (US); Jay Sheth, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/011,505

(22) PCT Filed: Jun. 16, 2022

(86) PCT No.: PCT/US2022/033858
§ 371 (c)(1),
(2) Date: Dec. 19, 2022

(87) PCT Pub. No.: WO2023/278171
PCT Pub. Date: Jan. 5, 2023

(65) Prior Publication Data
US 2024/0120205 A1 Apr. 11, 2024

Related U.S. Application Data

(60) Provisional application No. 63/216,519, filed on Jun. 29, 2021.

(51) Int. Cl.
*H01L 21/3065* (2006.01)
*H01J 37/32* (2006.01)

(52) U.S. Cl.
CPC .... *H01L 21/3065* (2013.01); *H01J 37/32174* (2013.01); *H01J 2237/3346* (2013.01)

(58) Field of Classification Search
CPC ............ H01L 21/31116; H01L 21/3065; H01J 37/32174; H01J 37/32146; H01J 37/32165
See application file for complete search history.

(56) References Cited

U.S. PATENT DOCUMENTS 6,093,332 A * 7/2000 Winniczek ........ H01J 37/32706
 216/2
8,926,850 B2 1/2015 Singh et al.
(Continued)

FOREIGN PATENT DOCUMENTS

WO 2021035132 A1 2/2021

OTHER PUBLICATIONS

Notification of Transmittal, ISR & Written Opinion PCT/US2022/033858, dated Nov. 2, 2022.

*Primary Examiner* — Binh X Tran
(74) *Attorney, Agent, or Firm* — PENILLA IP, APC

(57) ABSTRACT

A method for performing an etch process on a substrate includes applying a bias signal and a source signal to an electrode of a plasma processing system. The bias signal and the source signal are pulsed RF signals that together define a repeated pulsed RF cycle, wherein each pulsed RF cycle sequentially includes a first state, a second state, a third state, and a fourth state. The power level of the bias signal in the first state is greater than in the third state, which is greater than in the second state, which is greater than in the fourth state. The power level of the source signal in the first state is greater than in the third state, which is greater than in the second state, which is greater than in the fourth state.

25 Claims, 6 Drawing Sheets

(56) References Cited

U.S. PATENT DOCUMENTS

| | | |
|---|---|---|
| 9,123,509 B2 * | 9/2015 | Papasouliotis .... H01J 37/32412 |
| 9,378,931 B2 | 6/2016 | Kwon et al. |
| 9,768,033 B2 | 9/2017 | Ranjan et al. |
| 10,211,065 B2 | 2/2019 | Wang et al. |
| 10,483,127 B2 | 11/2019 | Wang et al. |
| 2009/0000946 A1 | 1/2009 | Singh et al. |
| 2009/0001890 A1 | 1/2009 | Singh et al. |
| 2009/0004836 A1 | 1/2009 | Singh et al. |
| 2011/0309049 A1 | 12/2011 | Papasouliotis et al. |
| 2013/0092529 A1 | 4/2013 | Singh et al. |
| 2016/0013063 A1 | 1/2016 | Ranjan et al. |
| 2016/0013067 A1 | 1/2016 | Wang et al. |
| 2016/0126069 A1 | 5/2016 | Kwon et al. |
| 2017/0207099 A1 * | 7/2017 | Ohtake ............. H01J 37/32183 |
| 2019/0096694 A1 | 3/2019 | Wang et al. |
| 2021/0050183 A1 * | 2/2021 | Ventzek ............ H01J 37/32146 |
| 2021/0358717 A1 * | 11/2021 | Kim ................. H01J 37/32706 |
| 2022/0068605 A1 * | 3/2022 | Fujiwara ........... H01J 37/32146 |
| 2022/0285130 A1 * | 9/2022 | Dole ................. H01J 37/32935 |

* cited by examiner

MULTIPLE STATE PULSING FOR HIGH ASPECT RATIO ETCH

Claim of Priority

This application is a national stage filing of and claims priority, under 35 U.S.C. § 371, to PCT/US22/33858, filed on Jun. 16, 2022, and titled "Multiple State Pulsing for High Aspect Ratio Etch", which claims the benefit of and priority, under 35 U.S.C. § 119 (e), to U.S. Provisional Patent Application No. 63/216,519, filed on Jun. 29, 2021, and titled "Multiple State Pulsing for High Aspect Ratio Etch", all of which are incorporated by reference herein in their entirety.

BACKGROUND

1. Field of the Disclosure

The present disclosure relates to semiconductor device fabrication.

2. Description of the Related Art

Plasma etching processes are often used in the manufacture of semiconductor devices on semiconductor wafers. In the plasma etching process, a semiconductor wafer that includes semiconductor devices under manufacture is exposed to a plasma generated within a plasma processing volume. The plasma interacts with material(s) on the semiconductor wafer so as to remove material(s) from the semiconductor wafer and/or modify material(s) to enable their subsequent removal from the semiconductor wafer. The plasma can be generated using specific reactant gases that will cause constituents of the plasma to interact with the material(s) to be removed/modified from the semiconductor wafer, without significantly interacting with other materials on the wafer that are not to be removed/modified. The plasma is generated by using radiofrequency signals to energize the specific reactant gases. These radiofrequency signals are transmitted through the plasma processing volume that contains the reactant gases, with the semiconductor wafer held in exposure to the plasma processing volume.

Current state-of-the-art high aspect ratio contact (HARC) etch processes use a three-state RF pulsing scheme. In this scheme, state 1 is typically a high peak power state that facilitates high aspect ratio etch with high selectivity. State 2 is typically set at '0' (substantially zero power) which provides neutral deposition on the mask which improves selectivity. State 3 can be chosen to be in a regime that provides passivation to mitigate bowing or in a different regime that improves not-open margin. As a result, there is typically a trade-off that involves bow control versus selectivity versus not-open margin.

It is within this context that the present disclosure arises.

SUMMARY

Broadly speaking, embodiments of the present disclosure provide methods and systems for four-state pulsing for high aspect ratio dielectric etch. Current high aspect ratio dielectric etch utilizes three-state pulsing, which has been sufficient for previous and current technology nodes. However, as the pitch shrinks for high aspect ratio capacitor structures, four-state pulsing offers more flexibility for tuning and controlling profile bowing, selectivity and not-open margin in high aspect ratio structures.

In some implementations, a method for performing an etch process on a substrate in a plasma processing system is provided, including: applying a bias signal to an electrode of the plasma processing system; and applying a source signal to the electrode; wherein the bias signal and the source signal are pulsed RF signals that together define a repeated pulsed RF cycle, wherein each pulsed RF cycle sequentially includes a first state, a second state, a third state, and a fourth state; wherein the first state is defined by the bias signal being pulsed at a first bias power level and the source signal being pulsed at a first source power level; wherein the second state is defined by the bias signal being pulsed at a second bias power level and the source signal being pulsed at a second source power level; wherein the third state is defined by the bias signal being pulsed at a third bias power level and the source signal being pulsed at a third source power level; wherein the fourth state is defined by the bias signal being pulsed at a fourth bias power level and the source signal being pulsed at a fourth source power level; wherein the first bias power level is greater than the third bias power level, and the third bias power level is greater than the second bias power level, and the second bias power level is greater than the fourth bias power level; wherein the first source power level is greater than the third source power level, and the third source power level is greater than the second source power level, and the second source power level is greater than the fourth source RF power level.

In some implementations, the second bias power level is less than the second source power level.

In some implementations, the second bias power level is about 1 to 20 percent of the first bias power level; wherein the second source power level is about 20 to 70 percent of the first source power level.

In some implementations, the third bias power level is about 30 to 70 percent of the first bias power level; wherein the third source power level is about 30 to 80 percent of the first source power level.

In some implementations, the fourth bias power level is a substantially zero power level, and wherein the fourth source power level is a substantially zero power level.

In some implementations, a duty cycle of the first state is approximately 3 to 30 percent of a duration of the pulsed RF cycle.

In some implementations, a duty cycle of the second state is approximately 3 to 30 percent of a duration of the pulsed RF cycle.

In some implementations, a duty cycle of the third state is approximately 3 to 30 percent of a duration of the pulsed RF cycle.

In some implementations, a duty cycle of the fourth state is approximately 35 to 75 percent of a duration of the pulsed RF cycle.

In some implementations, the first state and the third state are configured to effect etching of a feature on a surface of the substrate.

In some implementations, the second state and the fourth state are configured to effect passivation of the feature on the surface of the substrate.

In some implementations, the bias signal has a frequency less than about 10 MHz, and wherein the source signal has a frequency greater than about 20 MHz.

In some implementations, a controller device is provided, the controller device configured to cause a plasma processing system to perform an etch process on a substrate in said plasma processing system, the method including the following operations: applying a bias signal to an electrode of the plasma processing system; and applying a source signal to the electrode; wherein the bias signal and the source signal are pulsed RF signals that together define a repeated pulsed RF cycle, wherein each pulsed RF cycle sequentially includes a first state, a second state, a third state, and a fourth state; wherein the first state is defined by the bias signal being pulsed at a first bias power level and the source signal being pulsed at a first source power level; wherein the second state is defined by the bias signal being pulsed at a second bias power level and the source signal being pulsed at a second source power level; wherein the third state is defined by the bias signal being pulsed at a third bias power level and the source signal being pulsed at a third source power level; wherein the fourth state is defined by the bias signal being pulsed at a fourth bias power level and the source signal being pulsed at a fourth source power level; wherein the first bias power level is greater than the third bias power level, and the third bias power level is greater than the second bias power level, and the second bias power level is greater than the fourth bias power level; wherein the first source power level is greater than the third source power level, and the third source power level is greater than the second source power level, and the second source power level is greater than the fourth source RF power level.

In some implementations, a method for performing an etch process on a substrate in a plasma processing system is provided, including: applying a bias signal to a first electrode of the plasma processing system; and applying a source signal to a second electrode of the plasma processing system; wherein the bias signal and the source signal are pulsed RF signals that together define a repeated pulsed RF cycle, wherein each pulsed RF cycle sequentially includes a first state, a second state, a third state, and a fourth state; wherein the first state is defined by the bias signal being pulsed at a first bias power level and the source signal being pulsed at a first source power level; wherein the second state is defined by the bias signal being pulsed at a second bias power level and the source signal being pulsed at a second source power level; wherein the third state is defined by the bias signal being pulsed at a third bias power level and the source signal being pulsed at a third source power level; wherein the fourth state is defined by the bias signal being pulsed at a fourth bias power level and the source signal being pulsed at a fourth source power level; wherein the first bias power level is greater than the third bias power level, and the third bias power level is greater than the second bias power level, and the second bias power level is greater than the fourth bias power level; wherein the first source power level is greater than the third source power level, and the third source power level is greater than the second source power level, and the second source power level is greater than the fourth source RF power level.

The foregoing represents a summary of certain implementations, and further implementations will be apparent to those skilled in the art upon a full understanding of the present disclosure.

DETAILED DESCRIPTION

In the following description, numerous specific details are set forth in order to provide an understanding of embodiments of the present disclosure. It will be apparent, however, to one skilled in the art that the present disclosure may be practiced without some or all of these specific details. In other instances, well known process operations have not been described in detail in order not to unnecessarily obscure the present disclosure.

Current state-of-the-art high aspect ratio contact (HARC) etch processes use three-state RF pulsing. In this scheme, state 1 is typically a high peak power state that facilitates high aspect ratio etch with high selectivity. State 2 is typically set at substantially zero ('0') which provides neutral deposition on the mask which improves selectivity. State 3 can be chosen to be in a regime that provides passivation to mitigate bowing or in a different regime that improves the NOP margin. As a result, there is typically a trade-off that involves bow control versus selectivity versus not-open margin. However, a fourth state provides an additional knob and flexibility for tuning high aspect ratio etch profile, the requirement for which is becoming more and more stringent.

As discussed in further detail below, the addition of a fourth state, along with a specifically chosen third state, provides the flexibility to manage the trade-off between bow control, selectivity and not-open margin. For example, the fourth state can be chosen such that not-open margin is enhanced without impacting bowing or selectivity. Several power regimes have been identified which can address specific issues relating to HARC etch (i.e. bowing, selectivity, not-open margin). Based on the problem statement and desired outcome, one can choose a combination of pulse states that enable mitigation and management of trade-offs. Thus, the use of a fourth state provides an additional knob that can be used to address issues relating to HARC etch that were not previously possible using three-state pulsing.

Figure 1:
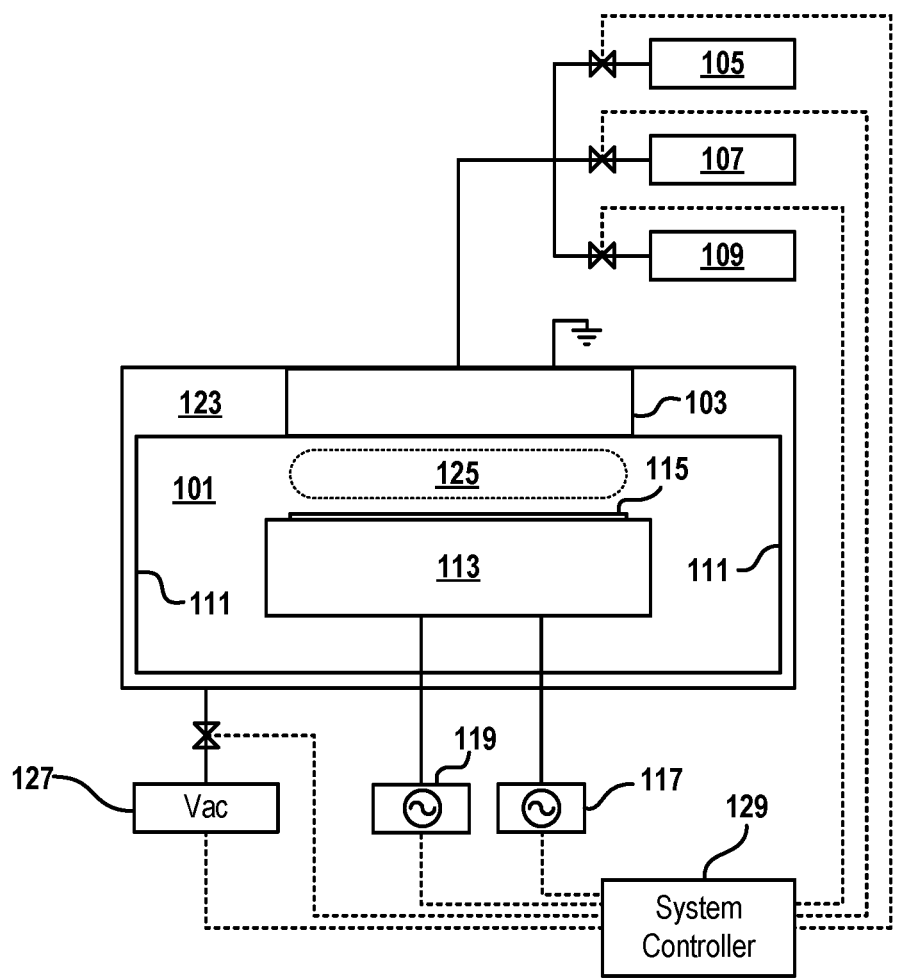
FIG. 1 shows a vertical cross-section view through a plasma processing system for use in semiconductor chip manufacturing, in accordance with some embodiments.

Various implementations described herein may be performed in a plasma processing system. With reference to FIG. 1, an example plasma processing system or apparatus may include a chamber 101 having a gas injector/showerhead/nozzle 103 for distributing gases (105, 107, 109) (e.g. reactant and purge gases) or other chemistries into the chamber 101, chamber walls 111, a chuck 113 for holding a substrate or wafer 115 to be processed which may include electrostatic electrodes for chucking and dechucking a wafer. The chuck 113 is heated for thermal control, enabling heating of the substrate 115 to a desired temperature.

In some implementations, the chuck 113 defines (or includes) a lower electrode of the plasma processing system. In some implementations, a source radiofrequency (RF) signal generator 119 is configured to supply high frequency source RF power to the lower electrode to generate a plasma in the plasma processing region 125 over the substrate 115. In some implementations, a bias RF signal generator 117 is configured to provide low frequency bias RF power to the lower electrode, in accordance with implementations of the disclosure.

In some implementations, the showerhead 103 defines an upper electrode of the plasma processing system. In some implementations, the source RF power or the bias RF power is applied to the upper electrode. In certain implementations, the source RF power is applied to the upper electrode, while the bias RF power is applied to the lower electrode.

In some implementations, the chamber walls are heated to support thermal management and efficiency. A vacuum source 127 provides a vacuum to evacuate gases from the chamber 101 through an exhaust port. The system or apparatus may include a system controller 129 for controlling some or all of the operations of the chamber or apparatus such as modulating the chamber pressure, inert gas flow, plasma source power, plasma source frequency, reactive gas flow; bias power, bias frequency, temperature, vacuum settings; and other process conditions.

In some implementations, a system/apparatus may include more than one chamber for processing substrates.

In some embodiments, the substrate is a semiconductor wafer undergoing a fabrication procedure. However, it should be understood that in various embodiments, the wafer can be essentially any type of substrate that is subjected to a plasma-based fabrication process. For example, in some embodiments, the wafer can be a substrate formed of silicon, sapphire, GaN, GaAs or SiC, or other substrate materials, and can include glass panels/substrates, metal foils, metal sheets, polymer materials, or the like. Also, in various embodiments, the wafer may vary in form, shape, and/or size. For example, in some embodiments, the wafer may correspond to a circular-shaped semiconductor wafer on which integrated circuit devices are manufactured. In various embodiments, the circular-shaped wafer can have a diameter of 200 mm (millimeters), 300 mm, 450 mm, or of another size. Also, in some embodiments, the wafer may correspond to a non-circular substrate, such as a rectangular substrate for a flat panel display, or the like, among other shapes.

In some implementations, the chuck of the plasma processing system includes an electrode positioned on a facilities plate and disposed below a top ceramic layer. The electrode can include an arrangement of temperature control fluid channels through which a temperature control fluid is flowed to control a temperature of the electrode and in turn control a temperature of the wafer. The chuck can include an arrangement of backside gas supply ports (not shown) that are fluidly connected to corresponding backside gas supply channels within the electrode. Lift pins can be configured to extend through the top surface of the chuck to provide for vertical movement of the wafer relative to the top surface of the chuck.

An impedance matching system includes an arrangement of inductors and capacitors sized and connected to provide for impedance matching so that radiofrequency power can be transmitted into the plasma processing region 125. In some embodiments, the source RF signal generator 119 is a high frequency radiofrequency signal generator, and the bias RF signal generator 117 is a low frequency radiofrequency signal generator. In some embodiments, the source RF signal generator generates radiofrequency signals within a range extending from about 50 MegaHertz (MHz) to about 70 MHz, or within a range extending from about 54 MHz to about 63 MHz, or at about 60 MHz. In some embodiments, the source RF signal generator supplies radiofrequency power within a range extending from about 5 kiloWatts (kW) to about 25 kW, or within a range extending from about 10 kW to about 20 kW, or within a range extending from about 15 kW to about 20 kW, or of about 10 kW, or of about 16 kW. In some embodiments, the bias RF signal generator 117 generates radiofrequency signals within a range extending from about 50 kiloHertz (kHz) to about 500 kHz, or within a range extending from about 330 kHz to about 440 kHz, or at about 400 kHz. In some embodiments, the bias RF signal generator supplies radiofrequency power within a range extending from about 15 kW to about 100 kW. In an example embodiment, the source RF signal generator 119 is set to generate radiofrequency signals having a frequency of about 60 MHz, and the bias RF signal generator 117 is set to generate radiofrequency signals having a frequency of about 400 kHz.

During plasma processing operations within the plasma processing system, the one or more process gas(es) are supplied to the plasma processing region 125 by way of the process gas supply system. Also, radiofrequency signals are transmitted into the plasma processing region by way of the radiofrequency signal generators, the impedance matching system, the facilities plate, the electrode, and through the ceramic layer. The radiofrequency signals transform the process gas(es) into the plasma within the plasma processing region 125. Ions and/or reactive constituents of the plasma interact with one or more materials on the wafer W to cause a change in composition and/or shape of particular material(s) present on the wafer W.

Figure 2:
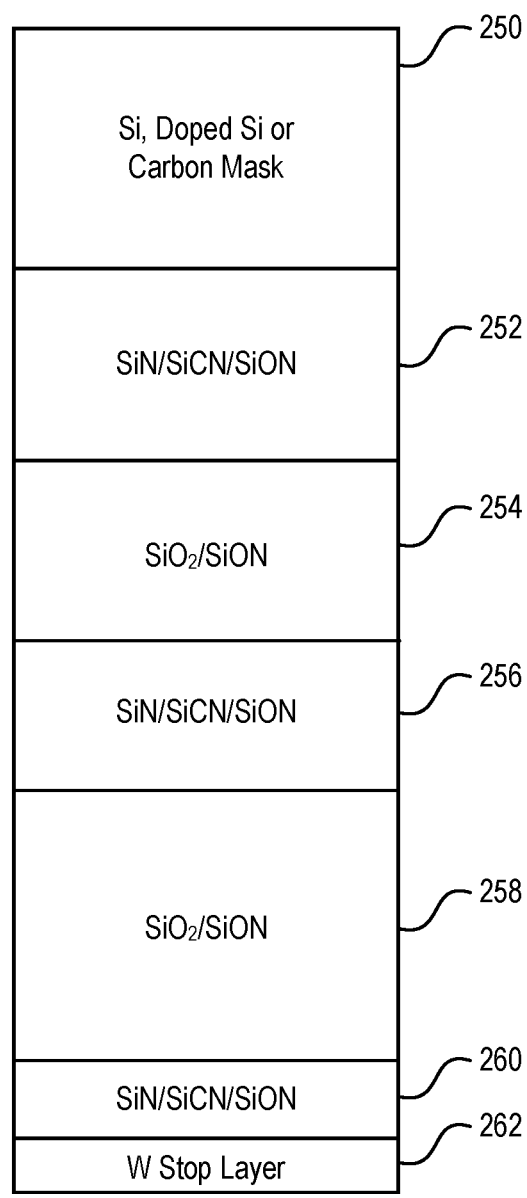
FIG. 2 conceptually illustrates a cross-section of a portion of a wafer for etching, in accordance with implementations of the disclosure.

FIG. 2 conceptually illustrates a cross-section of a portion of a wafer for etching, in accordance with implementations of the disclosure. In the illustrated implementation, a surface section of a wafer is conceptually shown, including a typical DRAM capacitor stack structure in which high aspect ratio contact holes/vias are etched.

As shown, the stack consists of a top silicon, doped silicon mask or carbon mask layer 250, a first silicon nitride (SiN) layer 252, a first (middle) silicon oxide (SiO) layer 254, a second (thin) SiN layer 256, a second (lower) SiO layer 258, a third (thin) SiN layer 260, and a tungsten (W) etch stop layer 262. For a typical DRAM device the stack may on the order of about 1 to 1.5 micron in height, and the manufacture of such DRAM devices includes fabrication of capacitors, entailing a capacitor etch process in which high aspect ratio contact vias are etched in the stack. The capacitor etch is one example of a dielectric etch process requiring suitable etching of very high aspect ratio features. By way of example without limitation, in some implementations, a high aspect ratio feature is one having a height-to-width ratio greater than or equal to, approximately, 60, 70, 80, 90, or 100 to one.

It will be appreciated that as pitch sizes continue to scale to smaller sizes, and as the aspect ratio of etched features continues to increase, there is less tolerance for defects in the etch process. For capacitor etch, by way of example without limitation, pitch size can be less than 50 nm in some implementations, less than 40 nm in some implementations, etc. It will be appreciated that while implementations of the present disclosure are described with reference to HARC etch to form DRAM capacitor structures, this is merely one example of a feature context calling for very high aspect ratio dielectric etch. It will be appreciated that the principles of the present disclosure can be applied to any high aspect ratio dielectric etch in any applicable device context (e.g. 3D NAND, for example memory hole etch).

RF pulsing technology has progressed from operating in a continuous wave mode (CW) to pulsing mode regimes (e.g. on-off, level-to-level). Current state-of-the-art RF pulsing regimes operate using a three-state pulsing scheme. The advances in multi-state RF pulsing have enabled improvements to high aspect ratio etch by improving process margin versus etch selectivity, profile bow, critical dimension (CD) and etch rate uniformity. However, as device size continues to shrink further and as pitch size is further reduced (e.g. to 50 nm and below), even under current state-of-the-art three-state RF pulsing technology, it is difficult to achieve further improvements in the etch selectivity versus process margin trade-off. Current technology regimes struggle to balance the health of the high aspect ratio etch while maintaining sufficient process margin (e.g. under-etch, not open, capping).

RF pulsing entails implementation of pulsed power levels for the high frequency RF signal (also known as the source power; e.g. frequency of about 60 MHz in some implementations) and the low frequency RF signal (also known as the bias power; e.g. frequency of about 400 kHz in some implementations). For example, in a two-state RF pulsing scheme, "State 1" (or "S1") is typically a high bias power and high source power state, e.g. greater than 1 kW, with ion energy greater than 3 keV, operated at a pressure less than 30 mTorr to obtain a narrow ion energy distribution function (IADF). The other state in the pulse, typically termed "State 0" (or "S0"), represents a deposition step with low/zero bias and low/zero source power, e.g. less than 1 kW, with ion energy less than 100 eV. State 0 mainly provides passivation attributed to different mechanisms such as direct ion deposition and ion activated neutral deposition. A typical pulse repetition rate for operating such an RF pulsing regime is about 100 Hz to 2 kHz.

A three-state pulsing scheme includes the above two states, with State 1 being typically high peak power that facilitates high aspect ratio etch with great selectivity, and State 2 typically set at '0' which provides neutral deposition on the mask which improves selectivity. To these, a State 3 can be chosen to be in a regime that provides passivation to mitigate bowing or in a different regime that improves not-open margin. Thus, in the three-state pulsing regime, there is typically a trade-off that involves bow control versus selectivity versus not-open margin. Thus, while the addition of a third state provides benefits over two-state RF pulsing, beyond a certain point, further improvement to three-state pulsing schemes has not been possible due to these trade-offs.

However, it has been discovered that specific application of a fourth-state provides the desired flexibility to manage the trade-off between bow control, selectivity and not-open margin. For example, the fourth state can be chosen such that not-open margin is enhanced without impacting bowing or selectivity. Several power regimes have been identified which can address specific issues relating to HARC etch (i.e. bowing, selectivity, not-open margin). More specifically, a fourth state in combination with a particular third state has been found to address issues relating to HARC etch, which was not previously possible with three-state pulsing.

Figure 3:
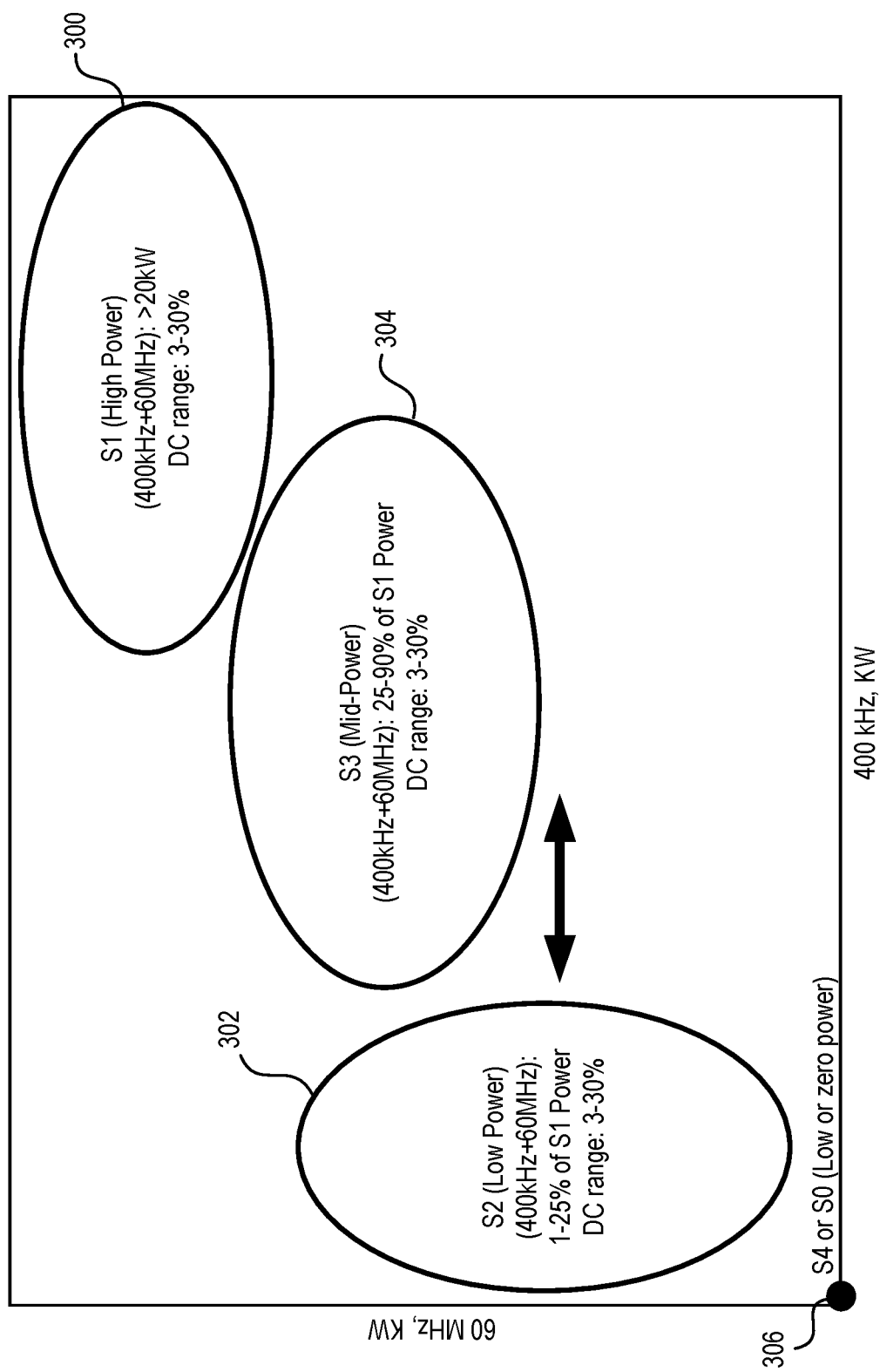
FIG. 3 is a graph conceptually illustrating various power regimes for a four-state RF pulsing regime for high aspect ratio dielectric etch, in accordance with implementations of the disclosure.

FIG. 3 is a graph conceptually illustrating various power regimes for a four-state RF pulsing regime for high aspect ratio dielectric etch, in accordance with implementations of the disclosure. In the illustrated graph, power of the high frequency RF signal versus power of the low frequency RF signal is shown, with power regimes for distinct pulsed RF states shown for a four-state RF pulsing scheme. These power regimes define ranges for the power levels of the high and low frequency RF signals for the various pulsed RF states, and further define relationships or ratios of the power levels of the high and low frequency RF signals for the various states.

In some implementations, State 1 (S1) is configured in a power regime 300, as conceptually shown in the illustrated graph. State 1 is a high power state configured to provide high aspect ratio etching, wherein both the high frequency source RF signal and the low frequency bias RF signal are operated (pulsed) at high power levels relative to the other states. In some implementations, the S1 bias (low frequency RF) power level is configured to be in the range of greater than 20 kW; in some implementations, in the range of about 30 to 40 kW. In some implementations the S1 source (high frequency RF) power level is configured to be in the range of greater than 7 kW; in some implementations, in the range of about 8 to 10 kW; in some implementations, about 9 kW. In some implementations the ratio of the bias power level to the source power level (for S1) is in the range of approximately 3:1 to 4:1. In some implementations the S1 duty cycle is in the range of about 3 to 30 percent (of the full pulsed RF cycle); in some implementations, in the range of about 7 to 9 percent.

Generally, S1 defines the highest power levels for the bias and source RF signals as compared to the other states of the pulsed RF cycle. S1 provides high aspect ratio etching with high selectivity to the mask when carried out with a low duty cycle such as that presently described. However, while S1 is capable of providing good selectivity, the trade-offs for S1 are the open margin and etch profile (e.g. SiN bowing) potentially being detrimentally affected.

In some implementations, State 2 (S2) is configured in a power regime 302. As shown, S2 is a low power state as compared to the other states, in which both the source and bias RF signals are operated at relatively low power levels compared to S1. In some implementations, the S2 bias (low frequency RF) power level is configured to be in the range of about 0.5 kW to 5 kW; in some implementations, in the range of about 1 kW to 3 kW. In some implementations the S2 source (high frequency RF) power level is configured to be in the range of about 2 kW to 7 kW; in some implementations in the range of about 3 to 5 kW.

In some implementations, the S2 bias power level is configured to be in the range of about 1 to 20 percent of the S1 bias power level; in some implementations, about 4 to 9 percent; in some implementations about 5 to 7 percent. In some implementations, the S2 source power level is configured to be in the range of about 20 to 70 percent of the S1 source power level; in some implementations, about 25 to 55 percent; in some implementations about 30 to 40 percent.

Unlike S1, S2 is configured so that the bias power level is less than the source power level. In some implementations the ratio of the bias power level to the source power level (for S2) is in the range of approximately 1:1 to 1:2; in some implementations, the ratio is less than about 0.8.

In some implementations the S2 duty cycle is in the range of about 3 to 30 percent of the full cycle; in some implementations, in the range of about 10 to 20 percent; in some implementations, about 15 percent.

By way of example without limitation, in some implementations, for an S2 bias power level of approximately 3 kW, the S2 source power level is approximately 5 kW; for an S2 bias power level of approximately 1.5 kW, the S2 source power level is approximately 2.5 kW.

In some implementations, the State 2 pulse configuration provides trimming of the neck, thereby improving the open margin. However, the trade-off for S2 is diminished selectivity to the mask.

In some implementations, State 3 (S3) is configured to operate in a power regime 304, as conceptually shown in the illustrated graph. State 3 is configured as a mid-power state, wherein both the high frequency source RF signal and the low frequency bias RF signal are operated at mid-power levels that are approximately between those of State 1 and State 2. In some implementations the S3 bias (low frequency RF) power level is configured to be in the range of about 10 to 24 kW; in some implementations, in the range of about 14 to 20 kW; in some implementations, about 16 to 18 kW. In some implementations the S3 source (high frequency RF) power level is configured to be in the range of about 3 to 7 kW; in some implementations, about 4 to 6 kW; in some implementations, about 5 kW.

Generally, the S3 bias and source power levels are between those of S1 and S2. In some implementations, the S3 bias power level is in the range of about 30 to 70 percent of the S1 bias power level; in some implementations, in the range of about 40 to 60 percent; in some implementations, about 50 percent. In some implementations the S3 source power level is in the range of about 30 to 80 percent of the S1 source power level; in some implementations, in the range of about 40 to 70 percent; in some implementations, in the range of about 50 to 60 percent.

In some implementations the ratio of the bias power level to the source power level (for S3) is in the range of approximately 1.3:1 to 3:1. Thus by way of example without limitation, for a bias power level of 12 kW, then the source power level could be about 7 kW in some implementations. Or for a bias power level of 14 kW, then the bias power level could be about 9 kW in some implementations. These are provided by way of example without limitation, as other power levels falling within the range of ratios are possible for S3. In some implementations, the ratio of the bias and source power levels for S3 is similar to that of S1, but S3 is configured at lower power levels compared to S1.

In some implementations the S3 duty cycle is in the range of about 3 to 30 percent of the full RF pulsing cycle; in some implementations, in the range of about 15 to 25 percent; in some implementations, about 20 percent.

In some implementations, S3 is configured as a mid-power etching state, configured to provide, in a relative sense, very good selectivity and reasonably good oxide and nitride profile, but the trade-off of S3 is the open margin due to necking issues. As compared to S1, S3 can be configured to provide similar selectivity but improved etch profile in terms of reduced SiN bowing and reduced oxide bowing.

In some implementations, State 4 (S4) is operated as a substantially zero power state or a very low power state, wherein each of the high frequency RF signal and the low frequency RF signal are set to substantially zero power levels, or near-zero or otherwise substantially lower power levels than S2. In some implementations, S4 bias power is in the range of about 0 to 1 kW; whereas in some implementations, S4 source power is in the range of about 0 to 1 kW. In some implementations, State 4 is referred to as State 0 (S0), which as noted above, provides for neutral deposition on the mask, and thereby improves selectivity. In some implementations, the S4 duty cycle in the range of about 35 to 75 percent of the full pulsed RF cycle; in some implementations, in the range of about 45 to 65 percent; in some implementations, in the range of about 50 to 60 percent.

In some implementations, S4 is configured to provide neutral deposition.

Having described the states S1, S2, S3, and S4 of a four-state RF pulsing scheme, a representative pulsed waveform is now described for purposes of illustration.

Figure 4:
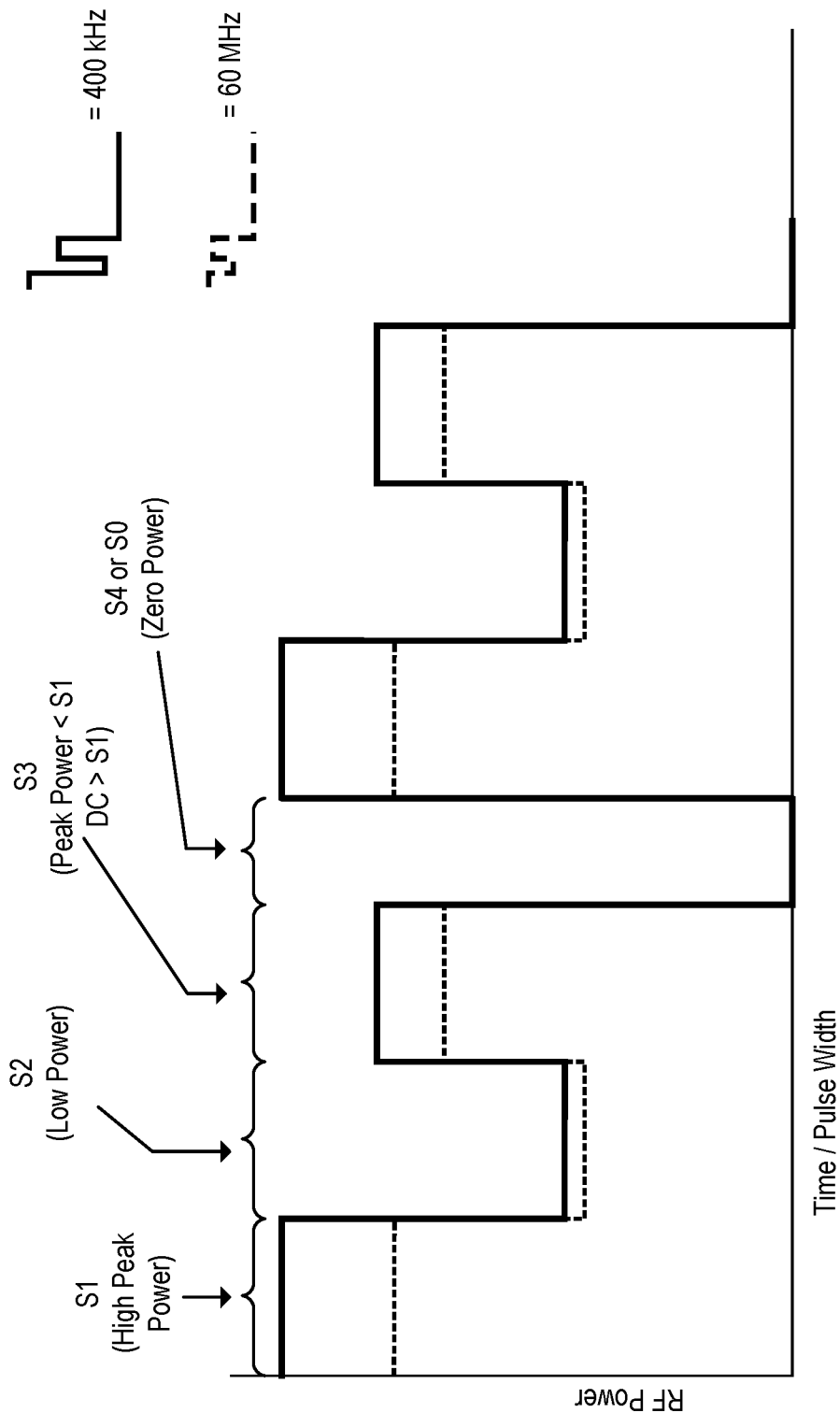
FIG. 4 conceptually illustrates a graph of RF power versus time for a four-state pulsed RF waveform, in accordance with implementations of the disclosure.

FIG. 4 conceptually illustrates a graph of RF power versus time for a four-state pulsed RF waveform, in accordance with implementations of the disclosure. Two complete cycles are shown for purposes of illustrating an example of a four-state pulsed RF waveform.

As shown in the illustrated implementation, S1 is a high peak power state, configured so that the low frequency (bias) RF signal and the high frequency (source) RF signal have (are pulsed at) their highest power levels of the pulsed RF cycle. In the illustrated implementation, the ratio of power levels of the bias RF signal to the source RF signal is about 2:1. However, as noted above, this ratio can vary is different implementations. The duty cycle of S1 is short, e.g. about 3 to 10 percent of the total RF pulsing cycle duration.

S2 follows S1 in the RF pulsing cycle, and is a low power state, with bias signal and source signal having (being pulsed at) comparatively low power levels. In some implementations, the power levels of the bias signal and/or the source signal during S3 are the lowest of the cycle except for S4. In some implementations, the ratio of the bias power to the source power is less than one. In different implementations, various power ratios are possible for S2 as indicated above. The duty cycle of S2 can be similar to that of S1 as shown in the illustrated implementation, but can also be greater than that of S1 as discussed previously.

S3 follows S2 in the pulsing cycle, and is configured as a mid-power state. That is, the power levels of the bias signal and the source signal are less than those of S1, but greater than those of S2. In the illustrated implementation, the ratio of the power levels of the bias and source signals for S3 is approximately 3:2. The ratio of the power levels of the bias and source signals for S3 can be similar to that of S1 in some implementations. Whereas in other implementations other ratios are possible for S3 as previously discussed. Generally, the duty cycle of S3 is greater than S1 in some implementations.

S4 follows S3 in the pulsing cycle, and is configured as a zero power state, wherein the power levels of the bias and source signals is zero or substantially zero. That is, during S4, no RF power is actively applied by the RF signal generators for the bias and source signals. S4 has the longest duty cycle of the various states. In some implementations, the duty cycle of S4 is greater than half of the total duration of the pulsed RF cycle, or greater than the combined duty cycles of the other states.

In the illustrated implementation, the states are repetitively cycled in the following order: S1→S2→S3→S4. However, in some implementations, the states are repetitively cycled in other orders, such as the following: S1 S2 S4 S3; or, S1 S4 S2 S3.

The implementation of a four-state RF pulsing scheme as described in the present disclosure provides improved results over three-state RF pulsing used in current state-of-the-art HARC etch. For in a three-state pulsed RF waveform, states S1 and S0 would be present, but the third state would be selected from either of a regime similar to S2 or S3, with its attendant trade-offs being unmitigated. And further, selecting power levels in between those of S2 and S3 does not provide the improved results of the presently disclosed four-state RF pulsing scheme.

Figure 5:
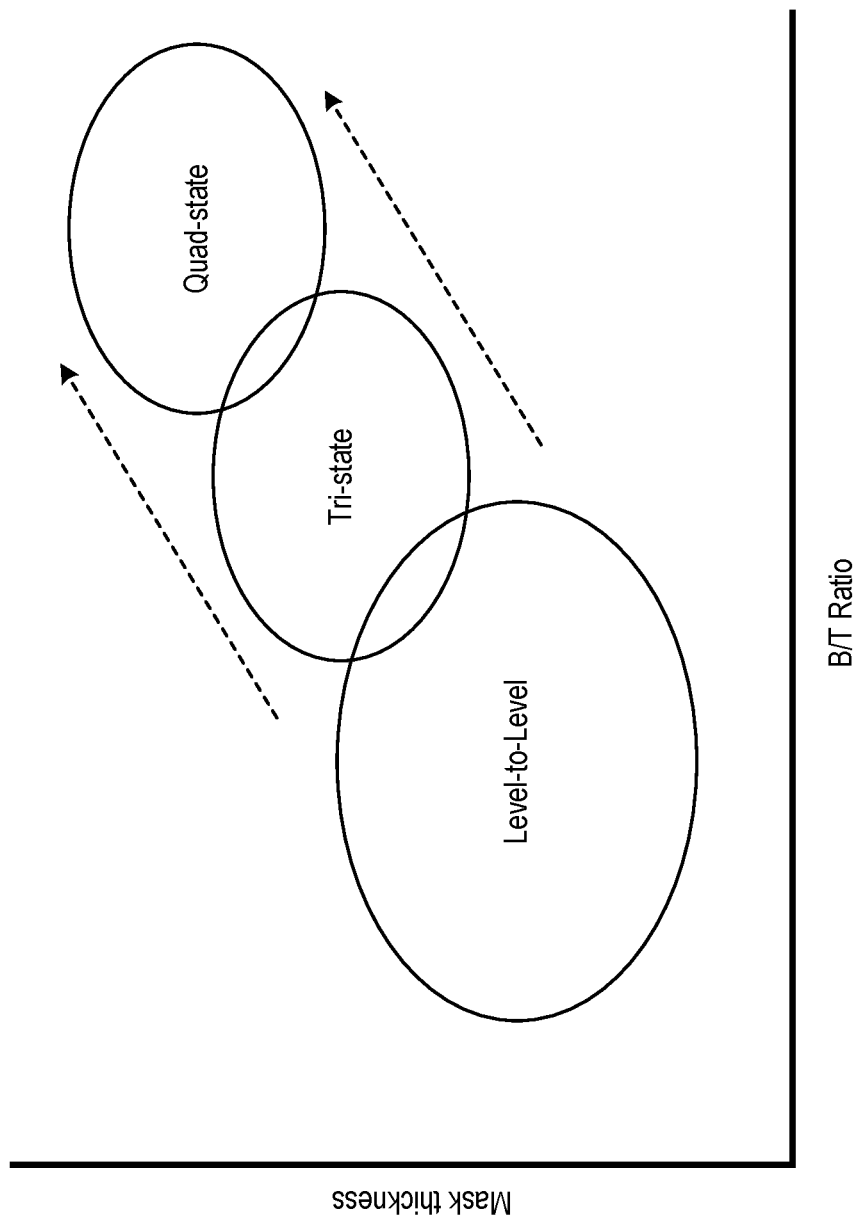
FIG. 5 conceptually illustrates the improved results that are possible with a four-state RF pulsing configuration, in accordance with implementations of the disclosure.

FIG. 5 conceptually illustrates the improved results that are possible with a four-state RF pulsing configuration, in accordance with implementations of the disclosure.

In the illustrated graph, mask thickness (e.g. R-polysilicon (nm)) versus the bottom-to-top critical dimension ratio (B/T ratio) is shown for various RF pulsing regimes. The mask thickness is indicative of the selectivity of the etch process, and the B/T ratio is indicative of the etched profile (e.g. amount of tapering or aspect ratio dependent etch (ARDE)). The B/T ratio is generally less than one due to tapering and ARDE, and improvements move the B/T ratio towards one. Typically, the tradeoff for B/T ratio is the mask thickness. That is, in order to open the bottom so that the bottom CD approaches the top CD, an etch process typically must sacrifice the mask thickness. However, by utilizing four-state RF pulsing in accordance with implementations of the disclosure, it is possible to simultaneously achieve improvements in the B/T ratio and the mask thickness.

As shown, level-to-level RF pulsing provides the lowest amount of remaining mask thickness and the lowest B/T ratio. Results are improved with three-state RF pulsing, which provides increased mask thickness and increased B/T ratio. However, while this represents an improvement to selectivity and etch profile, beyond a certain point it is not possible to attain further improvement to either the selectivity or the etch profile without a trade-off against the other.

But as shown in the illustrated graph, four-state RF pulsing in accordance with implementations of the disclosure enables improvement to both the selectivity and the etch profile, thereby breaking the current trade-off limitation of three-state RF pulsing, and extending the capabilities of the HARC etch process. In some implementations, this is achieved by states S1 and S3 of the four-state RF pulsing cycle being configured to recover the mask thickness, while S2 and S4 are configured to passivate bowing in the etched feature. The ability of the presently described four-state RF pulsing scheme to simultaneously improve selectivity and etch profile enables higher aspect ratio etch at lower pitch sizes, with greater device yield than previously possible.

It will be appreciated that any of the methods described in the present disclosure can be implemented to run automatically by the control system 120. In some implementations, a user interface associated with the control system is configured to enable a user to control various aspects of the etch process in accordance with the implementations described above. By way of example without limitation, these may include interface controls for setting of power levels and duty cycles of the different states of the RF pulsing cycle. In some implementations, when certain settings are user-defined, other settings can be automatically determined by the system based on the user-defined settings, wherein such automatically determined settings may or may not be further customized by the user. For example, in some implementations, when the power levels and duty cycles for S1 are user-defined, then the power levels and duty cycles for S2 and S3 are automatically determined based on S1. In some implementations, the power levels and duty cycles of S2 and S3 are determined as functions of those of S1. In some implementations, such functions can be user-defined or customized through the user interface. In some implementations, the user interface provides customization within a predefined range that can be abstracted for ease of use. For example, the power level of S3 is adjusted along an arbitrary scale (e.g. 1 to 10) provided by the user interface, that adjusts the S3 power level between a range of 30 to 70 percent of the S1 power level.

Figure 6:
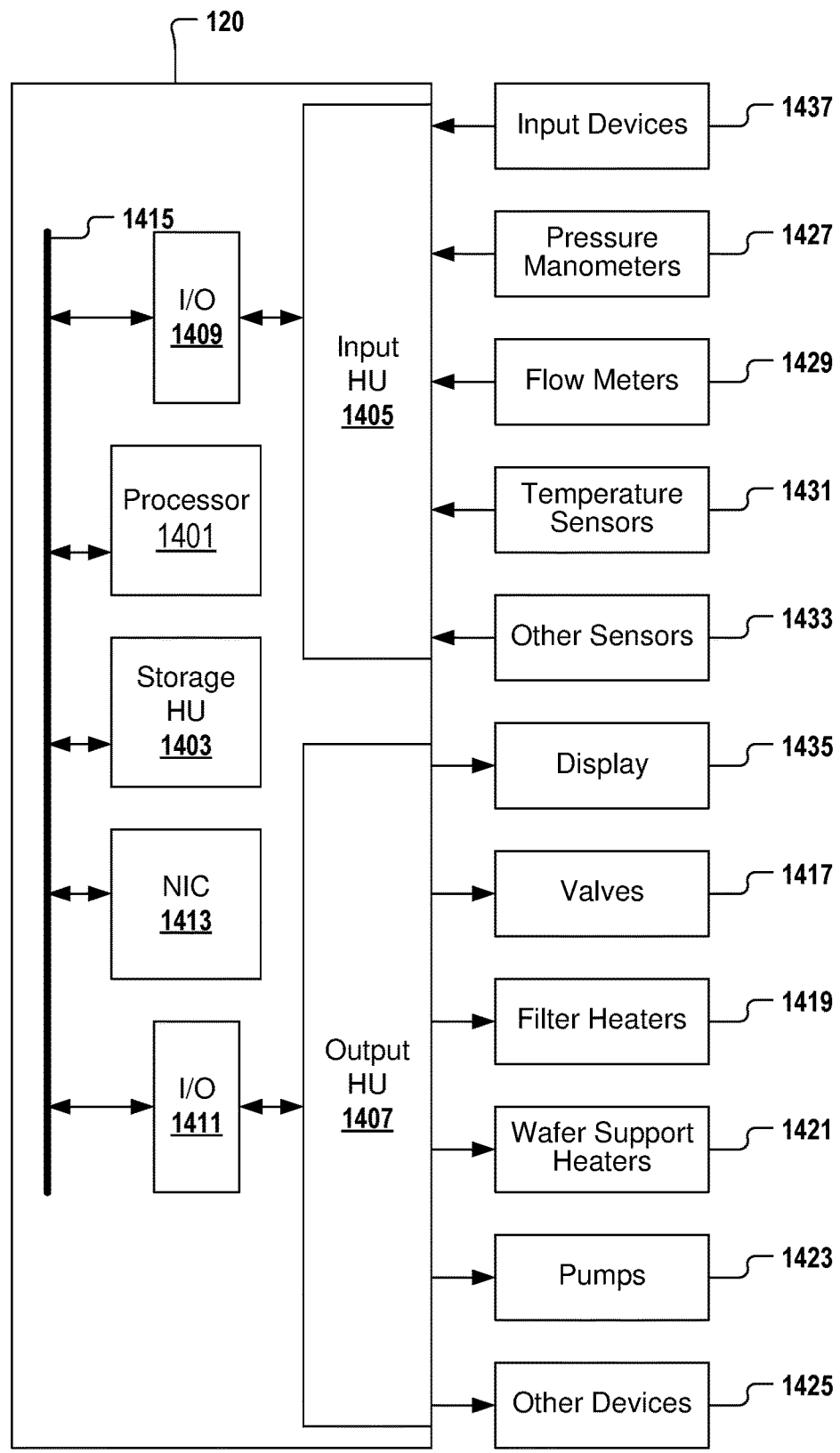
FIG. 6 shows an example schematic of the control system of FIG. 1, in accordance with implementations of the disclosure.

FIG. 6 shows an example schematic of the control system 120 of FIG. 1, in accordance with some embodiments. In some embodiments, the control system 120 is configured as a process controller for controlling the semiconductor fabrication process performed in plasma processing system 100. In various embodiments, the control system 120 includes a processor 1401, a storage hardware unit (HU) 1403 (e.g. memory), an input HU 1405, an output HU 1407, an input/output (I/O) interface 1409, an I/O interface 1411, a network interface controller (NIC) 1413, and a data communication bus 1415. The processor 1401, the storage HU 1403, the input HU 1405, the output HU 1407, the I/O interface 1409, the I/O interface 1411, and the NIC 1413 are in data communication with each other by way of the data communication bus 1415. The input HU 1405 is configured to receive data communication from a number of external devices. Examples of the input HU 1405 include a data acquisition system, a data acquisition card, etc. The output HU 1407 is configured to transmit data to a number of external devices. An examples of the output HU 1407 is a device controller. Examples of the NIC 1413 include a network interface card, a network adapter, etc. Each of the I/O interfaces 1409 and 1411 is defined to provide compatibility between different hardware units coupled to the I/O interface. For example, the I/O interface 1409 can be defined to convert a signal received from the input HU 1405 into a form, amplitude, and/or speed compatible with the data communication bus 1415. Also, the I/O interface 1407 can be defined to convert a signal received from the data communication bus 1415 into a form, amplitude, and/or speed compatible with the output HU 1407. Although various operations are described herein as being performed by the processor 1401 of the control system 120, it should be understood that in some embodiments various operations can be performed by multiple processors of the control system 120 and/or by multiple processors of multiple computing systems in data communication with the control system 120.

In some embodiments, the control system 120 is employed to control devices in various wafer fabrication systems based in-part on sensed values. For example, the control system 120 may control one or more of valves 1417, filter heaters 1419, wafer support structure heaters 1421, pumps 1423, and other devices 1425 based on the sensed values and other control parameters. The valves 1417 can include valves associated with control of the backside gas supply system 129, the process gas supply system 191, and the temperature control fluid circulation system 125. The control system 120 receives the sensed values from, for example, pressure manometers 1427, flow meters 1429, temperature sensors 1431, and/or other sensors 1433, e.g. voltage sensors, current sensors, etc. The control system 120 may also be employed to control process conditions within the plasma processing system 100 during performance of plasma processing operations on the wafer W. For example, the control system 120 can control the type and amounts of process gas(es) supplied from the process gas supply system 191 to the plasma processing region 182. Also, the control system 120 can control operation of the radiofrequency signal generators, the impedance matching system 143. Also, the control system 120 can control operation of the DC supply 117 for the clamping electrode(s). The control system 120 can also control operation of lifting devices for the lift pins and operation of the chamber door. The control system 120 also controls operation of the backside gas supply system and the temperature control fluid circulation system. It should be understood that the control system 120 is equipped to provide for programmed and/or manual control any function within the plasma processing system 100.

In some embodiments, the control system 120 is configured to execute computer programs including sets of instructions for controlling process timing, process gas delivery system temperature, and pressure differentials, valve positions, mixture of process gases, process gas flow rate, backside cooling gas flow rate, chamber pressure, chamber temperature, wafer support structure temperature (wafer temperature), RF power levels, RF frequencies, RF pulsing, impedance matching system settings, cantilever arm assembly position, bias power, and other parameters of a particular process. Other computer programs stored on memory devices associated with the control system 120 may be employed in some embodiments. In some embodiments, there is a user interface associated with the control system 120. The user interface include a display 1435 (e.g. a display screen and/or graphical software displays of the apparatus and/or process conditions), and user input devices 1437 such as pointing devices, keyboards, touch screens, microphones, etc.

Software for directing operation of the control system 120 may be designed or configured in many different ways. Computer programs for directing operation of the control system 120 to execute various wafer fabrication processes in a process sequence can be written in any conventional computer readable programming language: for example, assembly language, C, C++, Pascal, Fortran or others. Compiled object code or script is executed by the processor 1401 to perform the tasks identified in the program. The control system 120 can be programmed to control various process control parameters related to process conditions such as, for example, filter pressure differentials, process gas composition and flow rates, backside cooling gas composition and flow rates, temperature, pressure, plasma conditions, such as RF power levels and RF frequencies, bias voltage, cooling gas/fluid pressure, and chamber wall temperature, among others. Examples of sensors that may be monitored during the wafer fabrication process include, but are not limited to, mass flow control modules, pressure sensors, such as the pressure manometers 1427 and the temperature sensors 1431. Appropriately programmed feedback and control algorithms may be used with data from these sensors to control/adjust one or more process control parameters to maintain desired process conditions.

In some implementations, the control system 120 is part of a broader fabrication control system. Such fabrication control systems can include semiconductor processing equipment, including a processing tools, chambers, and/or platforms for wafer processing, and/or specific processing components, such as a wafer pedestal, a gas flow system, etc. These fabrication control systems may be integrated with electronics for controlling their operation before, during, and after processing of the wafer. The control system 120 may control various components or subparts of the fabrication control system. The control system 120, depending on the wafer processing requirements, may be programmed to control any of the processes disclosed herein, including the delivery of processing gases, the delivery of backside cooling gases, temperature settings (e.g. heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the control system 120 may be defined as electronics having various integrated circuits, logic, memory, and/or software that receive instructions, issue instructions, control operation, enable wafer processing operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g. software). Program instructions may be instructions communicated to the control system 120 in the form of various individual settings (or program files), defining operational parameters for carrying out a particular process on the wafer W within system 100. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The control system 120, in some implementations, may be a part of or coupled to a computer that is integrated with, coupled to the plasma processing system 100, or otherwise networked to the system 100, or a combination thereof. For example, the control system 120 may be in the "cloud" of all or a part of a fab host computer system, which can allow for remote access of the wafer processing. The computer may enable remote access to the system 100 to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to the system 100 over a network, which may include a local network or the Internet.

The remote computer may include a user interface that enables entry or programming of parameters and/or settings, which are then communicated to the system 100 from the remote computer. In some examples, the control system 120 receives instructions in the form of data, which specify parameters for each of the processing steps to be performed during one or more operations. It should be understood that the parameters may be specific to the type of process to be performed within the plasma processing system 100. Thus as described above, the control system 120 may be distributed, such as by comprising one or more discrete controllers that are networked together and working towards a common purpose, such as the processes and controls described herein. An example of a distributed controller for such purposes would be one or more integrated circuits on the plasma processing system 100 in communication with one or more integrated circuits located remotely (such as at the platform level or as part of a remote computer) that combine to control a process performed on the plasma processing system 100.

Without limitation, example systems that the control system 120 can interface with may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers. As noted above, depending on the process step or steps to be performed by the tool, the control system 120 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Embodiments described herein may also be implemented in conjunction with various computer system configurations including hand-held hardware units, microprocessor systems, microprocessor-based or programmable consumer electronics, minicomputers, mainframe computers and the like. Embodiments described herein can also be implemented in conjunction with distributed computing environments where tasks are performed by remote processing hardware units that are linked through a network. It should be understood that the embodiments described herein, particularly those associated with the control system 120, can employ various computer-implemented operations involving data stored in computer systems. These operations are those requiring physical manipulation of physical quantities. Any of the operations described herein that form part of the embodiments are useful machine operations. The embodiments also relate to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a general purpose computer selectively activated or configured by one or more computer programs stored in the computer memory, cache, or obtained over a network. When data is obtained over a network, the data may be processed by other computers on the network, e.g. a cloud of computing resources.

Various embodiments described herein can be implemented through process control instructions instantiated as computer-readable code on a non-transitory computer-readable medium. The non-transitory computer-readable medium is any data storage hardware unit that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes, and other optical and non-optical data storage hardware units. The non-transitory computer-readable medium can include computer-readable tangible medium distributed over a network-coupled computer system so that the computer-readable code is stored and executed in a distributed fashion.

Although the foregoing disclosure includes some detail for purposes of clarity of understanding, it will be apparent that certain changes and modifications can be practiced within the scope of the appended claims. For example, it should be understood that one or more features from any embodiment disclosed herein may be combined with one or more features of any other embodiment disclosed herein. Accordingly, the present embodiments are to be considered as illustrative and not restrictive, and what is claimed is not to be limited to the details given herein, but may be modified within the scope and equivalents of the described embodiments.

The invention claimed is:

1. A method for performing an etch process on a substrate in a plasma processing system, comprising:
applying a bias signal to an electrode of the plasma processing system; and
applying a source signal to the electrode;
wherein the bias signal and the source signal are pulsed RF signals that together define a repeated pulsed RF cycle, wherein each pulsed RF cycle sequentially includes a first state, a second state, a third state, and a fourth state;
wherein the first state is defined by the bias signal being pulsed at a first bias power level and the source signal being pulsed at a first source power level;
wherein the second state is defined by the bias signal being pulsed at a second bias power level and the source signal being pulsed at a second source power level;
wherein the third state is defined by the bias signal being pulsed at a third bias power level and the source signal being pulsed at a third source power level;
wherein the fourth state is defined by the bias signal being pulsed at a fourth bias power level and the source signal being pulsed at a fourth source power level;
wherein the first bias power level is greater than the third bias power level, and the third bias power level is greater than the second bias power level, and the second bias power level is greater than the fourth bias power level;
wherein the first source power level is greater than the third source power level, and the third source power level is greater than the second source power level, and the second source power level is greater than the fourth source RF power level.

2. The method of claim 1, wherein the second bias power level is less than the second source power level.

3. The method of claim 1, wherein the second bias power level is about 1 to 20 percent of the first bias power level; wherein the second source power level is about 20 to 70 percent of the first source power level.

4. The method of claim 1, wherein the third bias power level is about 30 to 70 percent of the first bias power level; wherein the third source power level is about 30 to 80 percent of the first source power level.

5. The method of claim 1, wherein the fourth bias power level is a substantially zero power level, and wherein the fourth source power level is a substantially zero power level.

6. The method of claim 1, wherein a duty cycle of the first state is approximately 3 to 30 percent of a duration of the pulsed RF cycle.

7. The method of claim 1, wherein a duty cycle of the second state is approximately 3 to 30 percent of a duration of the pulsed RF cycle.

8. The method of claim 1, wherein a duty cycle of the third state is approximately 3 to 30 percent of a duration of the pulsed RF cycle.

9. The method of claim 1, wherein a duty cycle of the fourth state is approximately 35 to 75 percent of a duration of the pulsed RF cycle.

10. The method of claim 1, wherein the bias signal has a frequency less than about 10 MHz, and wherein the source signal has a frequency greater than about 20 MHz.

11. The method of claim 1, wherein the first state and the third state are configured to effect etching of a feature on a surface of the substrate.

12. The method of claim 11, wherein the second state and the fourth state are configured to effect passivation of the feature on the surface of the substrate.

13. A controller device configured to cause a plasma processing system to perform an etch process on a substrate in said plasma processing system, the method including the following operations:
- applying a bias signal to an electrode of the plasma processing system; and
- applying a source signal to the electrode;
- wherein the bias signal and the source signal are pulsed RF signals that together define a repeated pulsed RF cycle, wherein each pulsed RF cycle sequentially includes a first state, a second state, a third state, and a fourth state;
- wherein the first state is defined by the bias signal being pulsed at a first bias power level and the source signal being pulsed at a first source power level;
- wherein the second state is defined by the bias signal being pulsed at a second bias power level and the source signal being pulsed at a second source power level;
- wherein the third state is defined by the bias signal being pulsed at a third bias power level and the source signal being pulsed at a third source power level;
- wherein the fourth state is defined by the bias signal being pulsed at a fourth bias power level and the source signal being pulsed at a fourth source power level;
- wherein the first bias power level is greater than the third bias power level, and the third bias power level is greater than the second bias power level, and the second bias power level is greater than the fourth bias power level;
- wherein the first source power level is greater than the third source power level, and the third source power level is greater than the second source power level, and the second source power level is greater than the fourth source RF power level.

14. The controller device of claim 13, wherein the second bias power level is less than the second source power level.

15. The controller device of claim 13, wherein the second bias power level is about 1 to 20 percent of the first bias power level;
wherein the second source power level is about 20 to 70 percent of the first source power level.

16. The controller device of claim 13, wherein the third bias power level is about 30 to 70 percent of the first bias power level;
wherein the third source power level is about 30 to 80 percent of the first source power level.

17. The controller device of claim 13, wherein the fourth bias power level is a substantially zero power level, and wherein the fourth source power level is a substantially zero power level.

18. The controller device of claim 13, wherein a duty cycle of the first state is approximately 3 to 10 percent of a duration of the pulsed RF cycle.

19. The controller device of claim 13, wherein a duty cycle of the second state is approximately 6 to 25 percent of a duration of the pulsed RF cycle.

20. The controller device of claim 13, wherein a duty cycle of the third state is approximately 10 to 30 percent of a duration of the pulsed RF cycle.

21. The controller device of claim 13, wherein a duty cycle of the fourth state is approximately 35 to 75 percent of a duration of the pulsed RF cycle.

22. The controller device of claim 13, wherein the bias signal has a frequency less than about 10 MHz, and wherein the source signal has a frequency greater than about 20 MHz.

23. The controller device of claim 13, wherein the first state and the third state are configured to effect etching of a feature on a surface of the substrate.

24. The controller device of claim 22, wherein the second state and the fourth state are configured to effect passivation of the feature on the surface of the substrate.

25. A method for performing an etch process on a substrate in a plasma processing system, comprising:
- applying a bias signal to a first electrode of the plasma processing system; and
- applying a source signal to a second electrode of the plasma processing system;
- wherein the bias signal and the source signal are pulsed RF signals that together define a repeated pulsed RF cycle, wherein each pulsed RF cycle sequentially includes a first state, a second state, a third state, and a fourth state;
- wherein the first state is defined by the bias signal being pulsed at a first bias power level and the source signal being pulsed at a first source power level;
- wherein the second state is defined by the bias signal being pulsed at a second bias power level and the source signal being pulsed at a second source power level;
- wherein the third state is defined by the bias signal being pulsed at a third bias power level and the source signal being pulsed at a third source power level;
- wherein the fourth state is defined by the bias signal being pulsed at a fourth bias power level and the source signal being pulsed at a fourth source power level;
- wherein the first bias power level is greater than the third bias power level, and the third bias power level is greater than the second bias power level, and the second bias power level is greater than the fourth bias power level;
- wherein the first source power level is greater than the third source power level, and the third source power level is greater than the second source power level, and the second source power level is greater than the fourth source RF power level.

* * * * *